(12) United States Patent
Hoshikawa et al.

(10) Patent No.: US 12,258,674 B2
(45) Date of Patent: Mar. 25, 2025

(54) PRODUCTION APPARATUS FOR METAL OXIDE SINGLE CRYSTAL AND PRODUCTION METHOD FOR METAL OXIDE SINGLE CRYSTAL

(71) Applicants: SHINSHU UNIVERSITY, Nagano (JP); Fujikoshi Machinery Corp., Nagano (JP)

(72) Inventors: Keigo Hoshikawa, Nagano (JP); Toshinori Taishi, Nagano (JP); Takumi Kobayashi, Nagano (JP)

(73) Assignee: Fujikoshi Machinery Corp., Nagano (JP)

( * ) Notice: Subject to any disclaimer, the term of this patent is extended or adjusted under 35 U.S.C. 154(b) by 235 days.

(21) Appl. No.: 18/077,455

(22) Filed: Dec. 8, 2022

(65) Prior Publication Data
US 2023/0235478 A1 Jul. 27, 2023

(30) Foreign Application Priority Data

Jan. 21, 2022 (JP) ................ 2022-007857

(51) Int. Cl.
C30B 29/16 (2006.01)
C30B 11/00 (2006.01)
C30B 35/00 (2006.01)

(52) U.S. Cl.
CPC .......... *C30B 11/002* (2013.01); *C30B 11/003* (2013.01); *C30B 29/16* (2013.01); *C30B 35/002* (2013.01)

(58) Field of Classification Search
CPC ..... C30B 11/002; C30B 11/003; C30B 29/16; C30B 35/002
See application file for complete search history.

(56) References Cited

U.S. PATENT DOCUMENTS

2012/0055396 A1* 3/2012 Dhanaraj ................ C30B 29/20
117/223
2021/0269941 A1 9/2021 Hoshikawa et al.

FOREIGN PATENT DOCUMENTS

WO WO2021068153 * 4/2021

* cited by examiner

*Primary Examiner* — Robert M Kunemund
(74) *Attorney, Agent, or Firm* — Stephen J. Weyer, Esq.; Stites & Harbison, PLLC

(57) ABSTRACT

A production apparatus for a metal oxide single crystal according to the present invention includes a crucible for housing a crystal raw material and a seed crystal, which has a first end and a second end, and in which the crystal raw material is disposed on a first end side, and the seed crystal is disposed on a second end side, a heater that heats the crucible, and a cooling rod, which has a third end and a fourth end, and in which the third end is provided in contact with or in proximity to the second end of the crucible so as to cool the second end by depriving the second end of heat.

10 Claims, 8 Drawing Sheets

UPPER SIDE
↑
↓
LOWER SIDE

UPPER SIDE
↕
LOWER SIDE

UPPER SIDE
↕
LOWER SIDE

UPPER SIDE
↕
LOWER SIDE

PRODUCTION APPARATUS FOR METAL OXIDE SINGLE CRYSTAL AND PRODUCTION METHOD FOR METAL OXIDE SINGLE CRYSTAL

CROSS-REFERENCE TO RELATED APPLICATION

This application is based upon and claims the benefit of priority of the prior Japanese Patent Application No. 2022-007857, filed on Jan. 21, 2022, and the entire contents of which are incorporated herein by reference.

TECHNICAL FIELD

The present invention relates to a production apparatus for a metal oxide single crystal, which is an apparatus for producing a metal oxide single crystal, and a production method for a metal oxide single crystal.

BACKGROUND ART

There has been known a production apparatus for a metal oxide single crystal (hereinafter sometimes referred to as "apparatus"). In one example, PTL 1 (JP-A-2021-134140) describes a production apparatus for a gallium oxide single crystal (hereinafter sometimes referred to as "gallium oxide crystal") to which a vertical Bridgman method (VB method) is applied. In the apparatus, first, a seed crystal (gallium oxide crystal) is housed at the bottom of a crucible, and further, a crystal raw material (for example, a sintered body of gallium oxide) is housed on the seed crystal. Subsequently, the crucible is disposed in a furnace. Subsequently, the inside of the furnace (crucible) is heated by a heater to melt the crystal raw material and a portion of the seed crystal (a portion on the crystal raw material side to serve as a starting point of crystal growth). Subsequently, the melt is cooled to start crystal growth from the melted portion of the seed crystal, and crystallization is allowed to proceed by solidifying the crystal raw material melt upward, and finally, the entire crystal raw material melt is crystallized.

In PTL 1, the crucible is configured to be vertically movable by operating a crucible shaft that supports the crucible from underneath, and the crucible is lowered relative to the position of the heater to grow the crystal. On the other hand, an apparatus to which a vertical temperature gradient freezing method (VGF method) in which a crystal growth interface is moved by changing the temperature distribution in the furnace instead of moving the crucible is applied is also known. Further, an apparatus or the like to which a horizontal Bridgman method (HB method) or a horizontal temperature gradient freezing method (HGF method) in which a crystal is grown in the horizontal direction is applied is also known.

SUMMARY OF INVENTION

Technical Problem

As described above, an operation in which when a crystal is grown, a temperature difference in the crystal growth direction (a temperature difference such that the temperature on the crystal raw material side is relatively high, and the temperature on the opposite side is relatively low) is generated in the seed crystal to melt a portion of the seed crystal (a portion on the crystal raw material side to serve as a starting point of crystal growth) is referred to as "seeding".

Here, as a problem that is particularly problematic in a production apparatus for a metal oxide single crystal for producing a high-melting point metal oxide single crystal in an oxidizing atmosphere as in the production apparatus for a gallium oxide crystal illustrated in PTL 1, there is a problem of seeding reliability. In one example, the melting point of gallium oxide is around 1800° C. Therefore, when a raw material of a gallium oxide crystal is melted and tried to be crystallized by creating an oxidizing atmosphere (which is referred to as an atmosphere containing an oxidizing gas such as oxygen in the present application, and includes, for example, "oxygen atmosphere" and "air atmosphere") in a furnace, a material that can be used in the furnace for creating such a temperature environment and an atmospheric environment is limited to a specified material such as alumina. When a crucible is heated by a heater in such a furnace, the temperature in the furnace reaches near the heat resistance limit of the material. Therefore, in order not to apply a load to the furnace, in one example, an internal furnace pipe composed of a heat retaining material is provided along the inner wall of a cylindrical furnace in PTL 1. This suppresses the heat release from the inside of the furnace (for example, a region which is a height region where a heat generating section of a heater is disposed and serves as a heat generating range of the heater) and improves the heat retaining property in the furnace.

However, according to this configuration, due to the improvement of the heat retaining property in the furnace, it becomes difficult to generate a temperature gradient around the crucible disposed in the furnace, and the temperature control of the seed crystal becomes difficult. As a result, when performing seeding, it becomes difficult to generate a temperature difference in the crystal growth direction in the seed crystal (here, a temperature difference between the upper and lower portions of the seed crystal) (for example, the temperature difference may be decreased to about 0.5 to 1.0° C.), and a problem that the seeding reliability deteriorates occurs.

Further, in PTL 1, as the crucible for growing a gallium oxide crystal, a crucible made of a platinum-rhodium alloy that is applied to a high-temperature environment and an oxidizing atmosphere environment is used, and also a support (adapter) made of zirconia, which has a high heat resistance temperature and does not react with platinum-rhodium, is provided at an upper end of the crucible shaft that supports the crucible from underneath. However, even with this configuration, due to the heat retaining effect of zirconia having a low thermal conductivity, it resulted in being difficult to generate a temperature difference in the crystal growth direction in the seed crystal when performing seeding. Therefore, a configuration capable of reliably generating a temperature difference in the crystal growth direction (for example, the vertical direction in the case of a VB method, a VGF method, or the like, and the horizontal direction in the case of an HB method, an HGF method, or the like) for a seed crystal when performing seeding was awaited.

Solution to Problem

The present invention has been accomplished in view of the above circumstances, and an object is to provide a production apparatus for a metal oxide single crystal, particularly a production apparatus for a metal oxide single crystal for producing a high-melting point metal oxide single crystal in an oxidizing atmosphere, wherein a temperature difference in a crystal growth direction (a temperature difference such that the temperature on the crystal raw material side is relatively high, and the temperature on the opposite side is relatively low) is reliably generated in a seed crystal when performing seeding, so that the seeding can be performed reliably, and to provide a production method for a metal oxide single crystal.

The present invention solves the above-mentioned problems by a means for solution as described below as an embodiment.

A production apparatus for a metal oxide single crystal according to the present invention is characterized by including a crucible for housing a crystal raw material and a seed crystal, which has a first end and a second end, and in which the crystal raw material is disposed on the first end side, and the seed crystal is disposed on the second end side, a heater that heats the crucible, and a cooling rod, which has a third end and a fourth end, and in which the third end is provided in contact with or in proximity to the second end of the crucible so as to cool the second end by depriving the second end of heat.

According to this, in the crucible in which the crystal raw material and the seed crystal are housed side by side in the crystal growth direction, by providing the cooling rod in contact with or in proximity to the second end and being a crucible portion with which the seed crystal portion (on the opposite side to the crystal raw material side) set so as to become an unmelted portion when melting a portion of the seed crystal (on the crystal raw material side) to perform seeding comes in contact, the second end is deprived of heat so that the second end can be cooled. As a result, a temperature difference such that the temperature on the crystal raw material side is relatively high, and the temperature on the opposite side is relatively low, that is, a temperature difference in the crystal growth direction can be generated in the seed crystal. Thus, a melted portion is formed on the crystal raw material side in the seed crystal, and an unmelted portion is formed on the opposite side, so that seeding can be performed reliably.

Further, it is preferred that a flow path for allowing a fluid to flow therethrough is provided inside the cooling rod. According to this, the fluid is allowed to flow through the inside of the cooling rod, and the second end of the crucible is deprived of heat by the fluid, so that the second end can be cooled.

Further, it may be configured such that the flow path is composed of a forward flow path through which the fluid flows to the third end side from the fourth end side of the cooling rod, and a return flow path through which the fluid flows to the fourth end side from the third end side of the cooling rod, and the forward flow path and the return flow path communicate with each other inside the third end of the cooling rod. In the configuration, it is preferred that the cooling rod has a double pipe structure, and the inside of an inner pipe in the double pipe structure serves as the forward flow path, and a gap between the inner pipe and an outer pipe serves as the return flow path. According to this, the fluid introduced into the flow path of the cooling rod flows through the forward flow path being an inner circumferential path and reaches the third end of the cooling rod and deprives the second end of the crucible of heat, and also enters the return flow path at the third end, and flows through the return flow path being an outer circumferential path, and is discharged outside the cooling rod (that is, outside the furnace), and thus, the second end of the crucible can be cooled.

Further, in the configuration in which the third end of the cooling rod is provided in proximity to the second end of the crucible, it may be configured such that the third end of the cooling rod has an opening, and the fluid flowing through the flow path to the third end side from the fourth end side of the cooling rod is discharged to the second end of the crucible from the opening. According to this, the fluid blown to the second end of the crucible hits the second end so as to deprive the second end of heat, and thus can cool the second end.

Further, in the configuration in which the third end of the cooling rod is provided in contact with the second end of the crucible, it is preferably configured such that the third end of the cooling rod and the second end of the crucible are in surface contact with each other. According to this, by configuring such that the contact area of the cooling rod with the second end of the crucible to be cooled is increased so that the cooling rod receives more heat, the cooling effect can be improved.

Further, it is preferred that the cooling rod is extended inside a crucible moving section that moves the crucible. According to this, in an apparatus that includes a moving mechanism for moving the crucible, to which a VB method, an HB method, or the like is applied, the cooling rod can be suitably provided.

Further, it is preferred that the crucible is disposed with the first end facing upward and the second end facing downward, a crucible shaft that supports the second end of the crucible from underneath is provided, and the cooling rod is extended inside the crucible shaft. According to this, in an apparatus, to which a VB method, a VGF method, or the like that involves growing a crystal in the vertical direction is applied, the cooling rod can be suitably provided.

Further, it is preferred that the cooling rod is disposed so as to coincide with the central axis of the crucible shaft. According to this, the cooling rod is prevented from coming in contact with the inner wall of the crucible shaft, so that sintering, deformation, and cracking of the cooling rod due to a high temperature can be prevented.

Further, the production apparatus for a metal oxide single crystal according to the present invention can be suitably applied as an apparatus for producing a metal oxide single crystal in an oxidizing atmosphere, and also as an apparatus for producing a high-melting point gallium oxide crystal.

Further, a production method for a metal oxide single crystal according to the present invention is characterized in that in a production method for a metal oxide single crystal, in which a crucible housing a seed crystal and a crystal raw material is heated by a heater so that a temperature difference is generated in the seed crystal to melt a portion of the seed crystal and also to melt the crystal raw material, and the melted portion of the seed crystal and the melted crystal raw material are solidified and crystallized from the seed crystal side to the crystal raw material side, from the outside of the crucible, a cooling rod is provided in contact with or in proximity to a crucible portion with which a seed crystal portion whose temperature is set to the lowest temperature when the temperature difference is generated in the seed crystal comes in contact, whereby the crucible portion is deprived of heat and cooled by the cooling rod.

Advantageous Effects of Invention

According to the present invention, a temperature difference in a crystal growth direction (a temperature difference such that the temperature on the crystal raw material side is relatively high, and the temperature on the opposite side is

DESCRIPTION OF EMBODIMENTS

First Embodiment

Figure 1A:
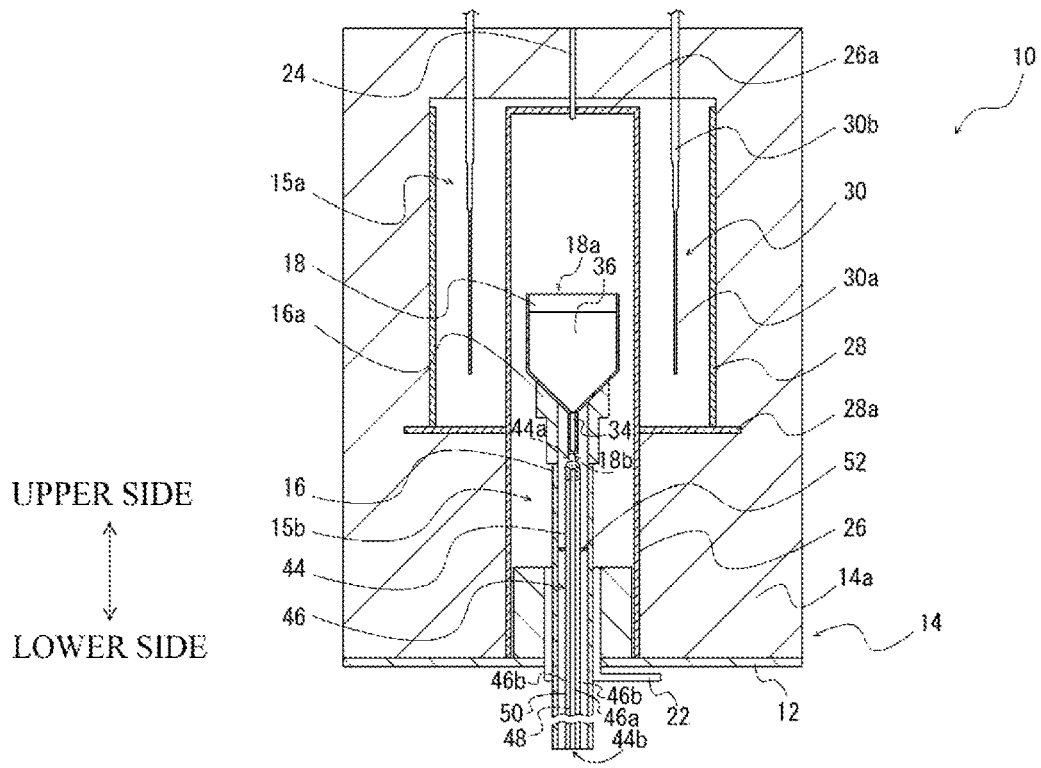
FIGS. 1A and 1B are schematic views (vertical sectional views) showing an example of a production apparatus for a metal oxide single crystal according to a first embodiment of the present invention, and show an example to which a resistance heater is applied as a heater.

Hereinafter, a first embodiment of the present invention will be described referring to the drawings. In all the drawings according to all the embodiments, members having the same function are assigned the same reference numeral, and their repeated description is sometimes omitted. The first embodiment of the present invention is an example of a production apparatus 10 for a metal oxide single crystal to which a VB method, a VGF method, or the like that involves growing a crystal in the vertical direction can be applied.

Figure 1B:
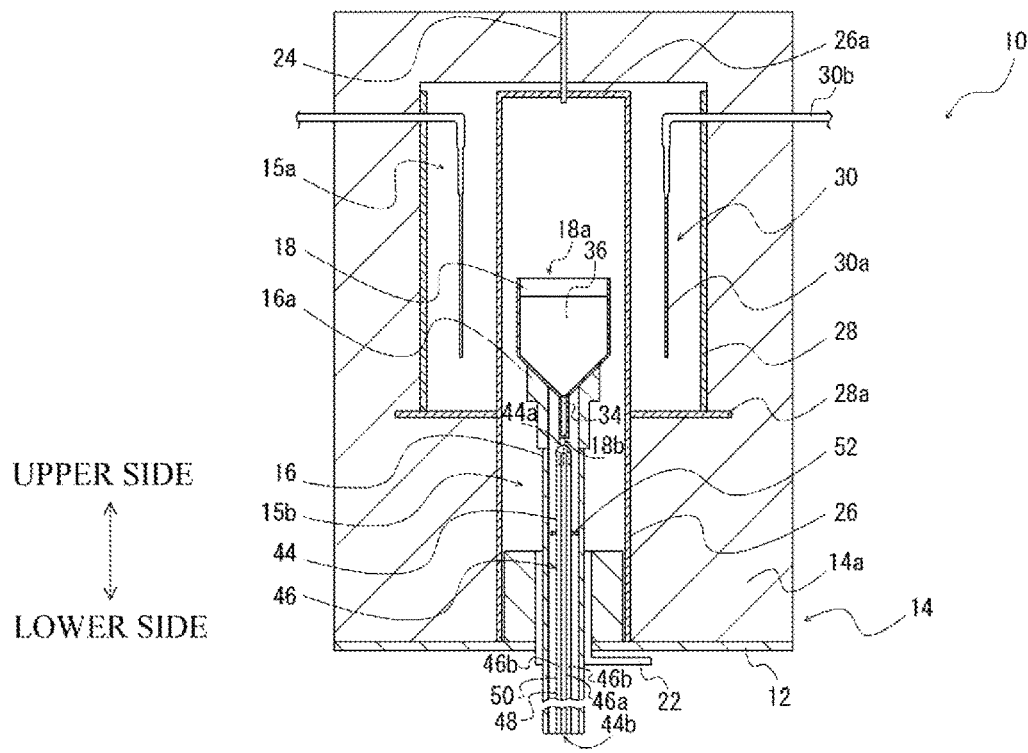
Figure 2:
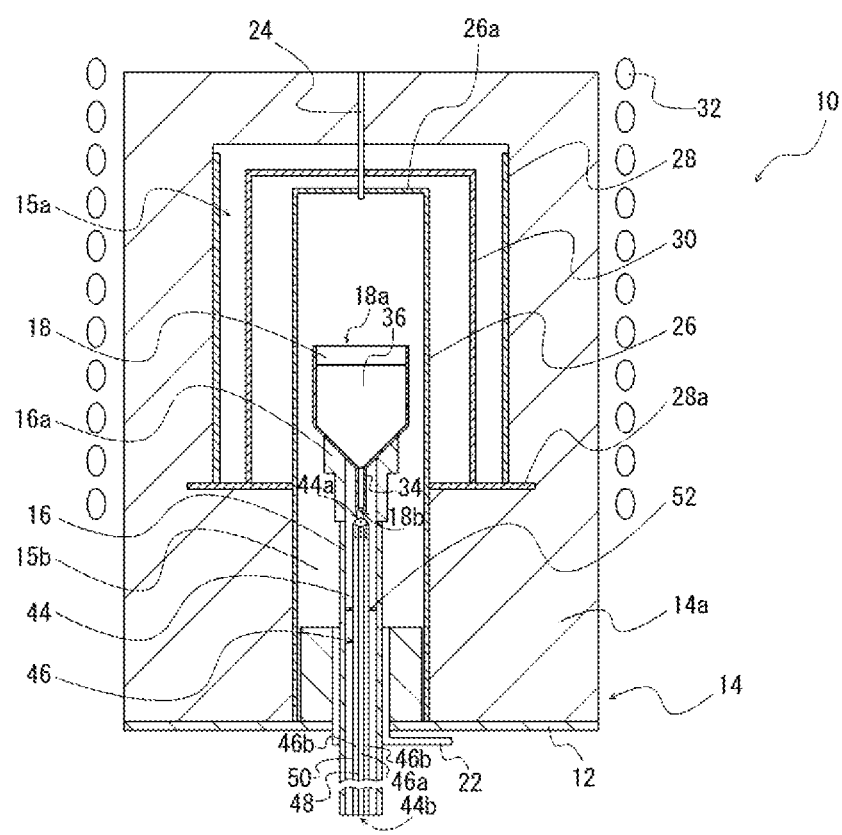
FIG. 2 is a schematic view (vertical sectional view) showing an example of the production apparatus for a metal oxide single crystal according to the first embodiment of the present invention, and shows an example to which an induction heater is applied as a heater.

FIGS. 1A, 1B, and 2 are vertical sectional views showing examples of the production apparatus 10 for a metal oxide single crystal according to the present embodiment. FIGS. 1A and 1B show examples to which a resistance heater 30 is applied as a heater 30. FIG. 2 shows an example to which an induction heater 30 is applied as the heater 30. Hereinafter, in one example, a basic configuration of the production apparatus 10 for a metal oxide single crystal according to the present embodiment will be described in accordance with FIG. 1A using gallium oxide ($Ga_2O_3$) as the metal oxide.

As shown in FIG. 1A, the production apparatus 10 for a metal oxide single crystal according to the present embodiment (the production apparatus 10 for a gallium oxide crystal) includes a crucible 18 for housing a crystal raw material 36 and a seed crystal 34, a furnace 14 for housing the crucible 18, a crucible shaft 16 that supports the crucible 18 from underneath and moves the crucible 18, a furnace core pipe 26 that surrounds the crucible 18 and the crucible shaft 16, an internal furnace pipe 28 that surrounds the furnace core pipe 26, and the heater 30 that is provided so that a heat generating section 30a is disposed in a space between the furnace core pipe 26 and the internal furnace pipe 28 and heats the crucible 18. Further, the present apparatus 10 includes a cooling rod 44 that cools a lower end 18b of the crucible 18.

The furnace 14 is provided on a base body 12, has a cylindrical shape, and is closed at the top. The furnace 14 is composed of a heat-resistant material such as alumina, and annular members 14a each having a specific size (a height, an outer diameter, and an inner diameter) are combined to fit one inside another and also stacked vertically to form a cylindrical shape, and a space is formed inside (boundaries between each annular member 14a are not shown). Each of the annular members 14a is formed by joining divided pieces that are divided radially from the center, thereby achieving its specific size. In the furnace 14, a crystal growth section 15a being a space with a relatively large inner diameter is provided, and a recessed section 15b being a space with a relatively small inner diameter is formed in communication with a central portion of the bottom face of the crystal growth section 15a.

Further, the crucible shaft 16 penetrates the base body 12 so as to coincide with the central axis of the furnace 14, and also is extended in the vertical direction to near the mid-height of the crystal growth section 15a through the recessed section 15b. The crucible shaft 16 is configured to be vertically movable and axially rotatable by a driving mechanism (not shown). When crystal growth is performed, the crucible 18 is disposed on the crucible shaft 16, and by operating the crucible shaft 16, the crucible 18 can be vertically moved or axially rotated in the furnace 14. That is, in the present embodiment, the crucible shaft 16 has both functions: a function of supporting the crucible 18; and a function of moving the crucible 18. The "crucible shaft that supports the second end of the crucible from underneath" and the "crucible moving section that moves the crucible" in the claims of the present application both correspond to the crucible shaft 16 in the present embodiment. On the other hand, in the apparatus 10 to which a VGF method is applied, the crucible shaft 16 does not necessarily need to have a function of moving the crucible 18, and need only have at least a function of supporting the crucible 18. Further, the crucible shaft 16 is configured to be taken out of the furnace 14 from the bottom of the recessed section 15b. Therefore, when the crucible 18 is taken in and out of the furnace 14, it is taken in and out together with the crucible shaft 16.

Further, as the crucible 18 for growing a gallium oxide crystal according to the present embodiment, a crucible made of a platinum-based alloy, for example, a crucible 18 made of a platinum-rhodium alloy (for example, having a Rh content of 10 to 30 wt %) or a crucible 18 made of a platinum-iridium alloy (for example, having an Ir content of 20 to 30 wt %), or the like is suitably applied. The crucible shaft 16 according to the present embodiment is configured in the form of a shaft of a heat-resistant material such as alumina, and further thereon, a support 16a (adapter 16a) composed of zirconia, which has a higher heat resistance temperature (for example, about 2000° C.) and does not react with a platinum-rhodium alloy or the like that forms the crucible 18 at a high temperature, is provided. According to this, the crucible 18 can be more stably disposed. However, the support 16a (adapter 16a) is an optional configuration. Further, the support 16a (adapter 16a) is a configuration included in the concept of the crucible shaft 16 as a portion of the crucible shaft 16.

Figure 3A:
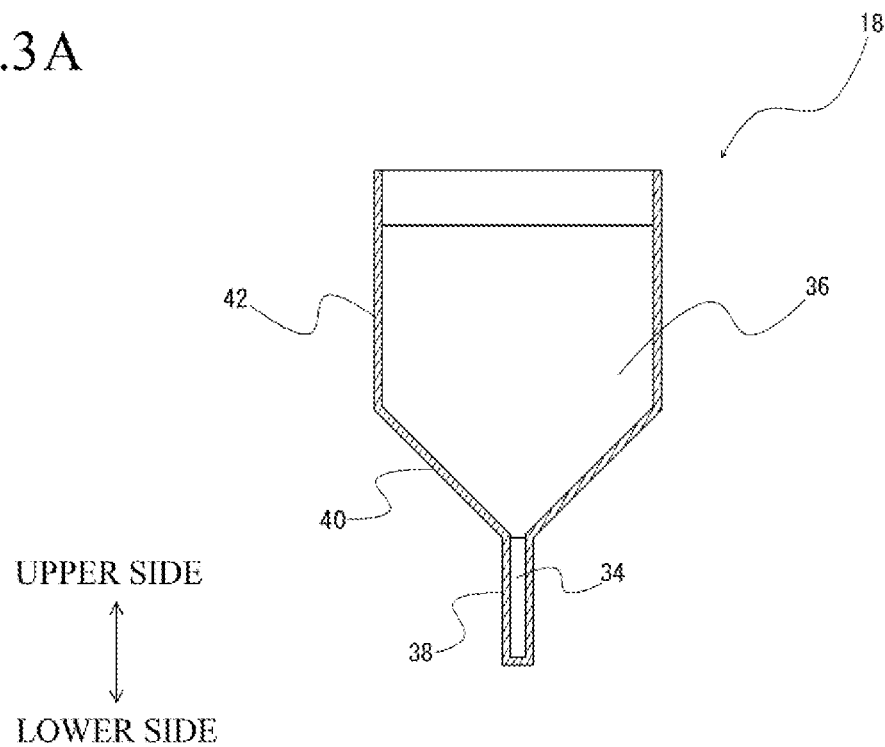
FIG. 3A is an enlarged view enlarging a crucible in the production apparatus for a metal oxide single crystal shown in FIG. 1A.
Figure 3B:
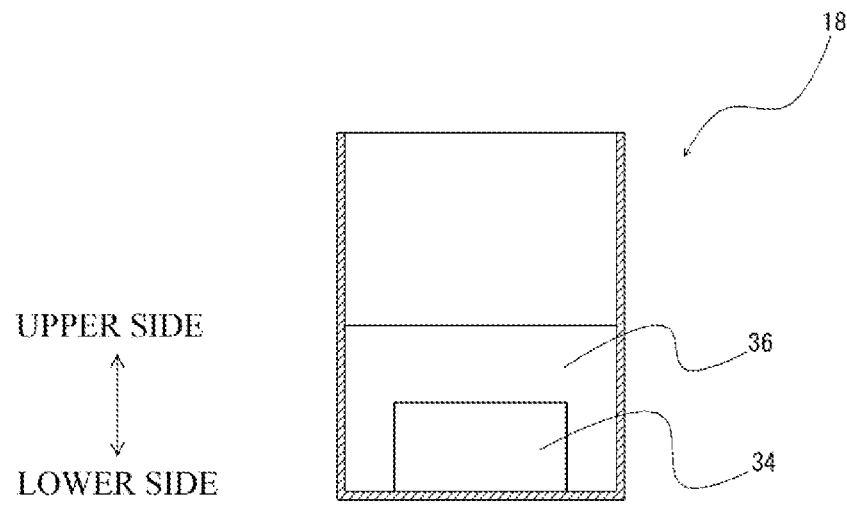
FIG. 3B is a schematic view (vertical sectional view) showing another example of the crucible shown in FIG. 3A.

Further, as shown in FIG. 3A, the crucible 18 for housing the crystal raw material 36 and the seed crystal 34 is formed in a funnel shape composed of a small-diameter section 38 with a cylindrical shape closed at one end, a large-diameter section 42 with a cylindrical shape opened at both ends, and an enlarged diameter section 40 which is extended while enlarging the diameter from the small-diameter section 38 to the large-diameter section 42 between the small-diameter section 38 and the large-diameter section 42. However, the shape of the crucible 18 is not limited thereto. In another example, as shown in FIG. 3B, it may simply be formed in a cylindrical shape closed at one end. The crucible 18 is disposed on the crucible shaft 16 (support 16a) with one end that is open as an upper end 18a and the other end that is closed as the lower end 18b (in FIG. 3A, with the end on a large-diameter section 42 side facing upward and the end on a small-diameter section 38 side facing downward). The shape of the crucible shaft 16 (support 16a) may also be appropriately set according to the shape of the crucible 18.

Further, in the inside of the hollow crucible shaft 16, the cooling rod 44 that cools the lower end 18b of the crucible 18 is extended. The details of the cooling rod 44 will be described later. Further, a thermocouple 20 (in FIG. 10, a temperature measuring section being a part of the thermocouple 20 is shown with a reference numeral 20) that measures the temperature of a predetermined portion of the crucible 18 is provided in a gap between the inner wall of the crucible shaft 16 and the cooling rod 44. The number of thermocouples 20 and the place where the temperature measuring section is disposed are not limited.

Further, an inlet pipe 22 that penetrates the base body 12 and opens to the recessed section 15b to communicate the inside and the outside of the furnace 14 is provided. Further, an exhaust pipe 24 that penetrates the top of the furnace 14 so as to coincide with the central axis of the furnace 14 and communicates the inside and the outside of the furnace 14 is provided. The inside of the furnace 14 is generally configured to be an air atmosphere by the inlet pipe 22 and the exhaust pipe 24, however, for example, the atmosphere (for example, the oxygen concentration) in the furnace 14 may be adjusted by adjusting the air inflow rate from the inlet pipe 22 or the like. Further, the inside of the furnace 14 may be adjusted to a predetermined atmosphere (for example, an oxygen atmosphere) by introducing a predetermined gas (for example, oxygen) other than air from the inlet pipe 22. The inlet pipe 22 may be provided on the lower side in the furnace 14, and the exhaust pipe 24 may be provided on the upper side in the furnace 14, and the positions of the inlet pipe 22 and the exhaust pipe 24 are not limited.

The furnace core pipe 26 is extended along the inner wall of the recessed section 15b from the bottom of the recessed section 15b to the top of the crystal growth section 15a. Further, the top of the furnace core pipe 26 is covered with a top plate 26a, and the furnace core pipe 26 surrounds the lateral and upper sides of the crucible 18 and the crucible shaft 16 (However, the lower end of the exhaust pipe 24 penetrates the top plate 26a to communicate with the interior of the furnace core pipe 26). With the use of the furnace core pipe 26, the flow of heat around the crucible 18 is controlled, so that a required temperature gradient condition can be created around the crucible 18 during crystal growth.

Further, the internal furnace pipe 28 is extended along the inner wall of the crystal growth section 15a from the bottom to the top of the crystal growth section 15a. The internal furnace pipe 28 surrounds the lateral sides of the heat generating section 30a of the heater 30 disposed in the crystal growth section 15a. With the use of the internal furnace pipe 28, the flow of heat from the heater 30 is suppressed, so that sintering, deformation, and cracking of the furnace 14 (annular member 14a) due to a high temperature can be prevented. Therefore, the internal furnace pipe 28 is preferably composed of zirconia or the like having a low thermal conductivity. The internal furnace pipe 28 is supported by an annular support plate 28a.

Further, the heater 30 is provided such that the heat generating section 30a is disposed in the space between the furnace core pipe 26 and the internal furnace pipe 28 in the crystal growth section 15a. The heater 30 shown in FIGS. 1A and 1B is the resistance heater 30 and generates heat by being supplied with electricity. In the example shown in FIG. 1A, the heat generating section 30a is extended in the vertical direction in the crystal growth section 15a, and also an electrically conductive section 30b connected to the heat generating section 30a is extended in the vertical direction as it is to penetrate the top of the furnace 14, and is connected to an external power source (not shown) at the furnace 14 (the same applies to FIGS. 4A, 4B, 4C, 4D, and 5). Further, in the example shown in FIG. 1B, the heat generating section 30a is extended in the vertical direction in the crystal growth section 15a, and also the electrically conductive section 30b connected to the heat generating section 30a is bent in the horizontal direction to penetrate the side of the furnace 14, and is connected to an external power source (not shown) at the furnace 14. In this manner, in both examples in FIGS. 1A and 1B, by extending the heat generating section 30a in the vertical direction, a temperature gradient condition in the vertical direction such that the temperature of the upper part is high and the temperature of the lower part is low can be created around the crucible 18. Although not visible in FIGS. 1A and 1B, the tip of the heat generating section 30a is formed into a U shape, and the heat generating section 30a and the electrically conductive section 30b are paired and extended.

Further, in FIGS. 1A and 1B, two heaters 30 are shown, but the number of heaters 30 is not limited. Preferably, a plurality of heaters 30 are arranged at equal intervals so as to surround the circumference of the crucible 18 in a circle with the furnace core pipe 26 interposed therebetween. The resistance heater 30 is composed of, for example, molybdenum disilicide ($MoSi_2$) or the like.

On the other hand, the heater 30 shown in FIG. 2 is the induction heater 30, and an electrical current with a predetermined frequency is allowed to flow through a coil 32 connected to an AC power source to cause the heater 30 disposed in the coil 32 to generate heat. In the example shown in FIG. 2, the coil 32 is provided outside the furnace 14 (around the furnace 14). Further, the heater 30 is provided in the crystal growth section 15a so as to surround the top of the crucible shaft 16 and the lateral and upper sides of the crucible 18 with the furnace core pipe 26 interposed therebetween (provided that the lower end of the exhaust pipe 24 penetrates the heater 30 and further penetrates the top plate 26a of the furnace core pipe 26 to communicate with the interior of the furnace core pipe 26). The induction heater 30 is composed of, for example, a platinum-based alloy, more specifically, a platinum-rhodium alloy (for example, having a Rh content of 10 to 30 wt %) or the like. In that case, it is preferred that the entire front and back surfaces of the heater 30 are coated with zirconia or the like. According to this, the oxidative decomposition of rhodium in the heater 30 due to a high temperature can be prevented.

A gallium oxide crystal can be produced by applying, for example, a VB method as described below to the production apparatus 10 for a metal oxide single crystal (the production apparatus 10 for a gallium oxide crystal) according to the present embodiment configured as described above.

First, the seed crystal 34 (for example, a gallium oxide crystal) is housed at the bottom of the crucible 18, and the crystal raw material 36 (for example, a sintered body of gallium oxide) is housed on the seed crystal 34, whereby the seed crystal 34 is disposed on a lower end 18b side of the crucible 18, and the crystal raw material 36 is disposed on an upper end 18a side. According to this, the seed crystal 34 and the crystal raw material 36 are housed in the crucible 18 in the same alignment direction as the crystal growth direction (in the case of a VB method, the direction from the lower side to the upper side) and in such a manner that the seed crystal 34 is disposed on the starting point side in the crystal growth direction, and the crystal raw material 36 is disposed on the end point side. As a result, the melted crystal raw material 36 can be grown into a crystal from the lower side to the upper side starting from a melted portion 34A of the seed crystal 34. The "first end" in the claims of the present application corresponds to the upper end 18a in the present embodiment. Further the "second end" in the claims of the present application corresponds to the lower end 18b in the present embodiment.

However, the description here that the seed crystal 34 is disposed on the lower end 18b side of the crucible 18, and the crystal raw material 36 is disposed on the upper end 18a side means that the seed crystal 34 is disposed on the lower end 18b side, and the crystal raw material 36 is disposed on the upper end 18a side in a relative alignment relationship between the seed crystal 34 and the crystal raw material 36. Therefore, for example, as shown in FIG. 3B, the crystal raw material 36 does not necessarily need to be filled up to the upper end 18a or the vicinity thereof, and also, the seed crystal 34 and the crystal raw material 36 do not necessarily need to be completely separated into upper and lower two layers.

With the use of the crucible 18 in a funnel shape according to the present embodiment, as shown in FIG. 3A, by housing the seed crystal 34 in the small-diameter section 38, the seed crystal 34 can be housed in the crucible 18 in a posture extended in the crystal growth direction and also in a stable posture.

Subsequently, the crucible 18 is disposed on the crucible shaft 16 in the furnace 14, and the inside of the furnace 14 (crucible 18) is heated by the heater 30. By adjusting the vertical position of the crucible 18 or the like, a temperature difference is generated in the seed crystal 34 to melt a portion of the seed crystal 34 (a portion on a crystal raw material 36 side serving as a starting point for crystal growth), so that seeding is performed, and also, the surrounding of the crucible 18 is heated to about 1800° C. to melt the crystal raw material 36. Further, a temperature gradient condition suitable for crystal growth is created around the crucible 18. Subsequently, the crucible shaft 16 is operated to slowly lower the crucible 18, and the melted crystal raw material 36 is cooled and solidified from the lower side, and a crystal is grown upward starting from the melted portion 34A of the seed crystal 34. In this manner, a gallium oxide crystal can be produced.

Figure 4A:
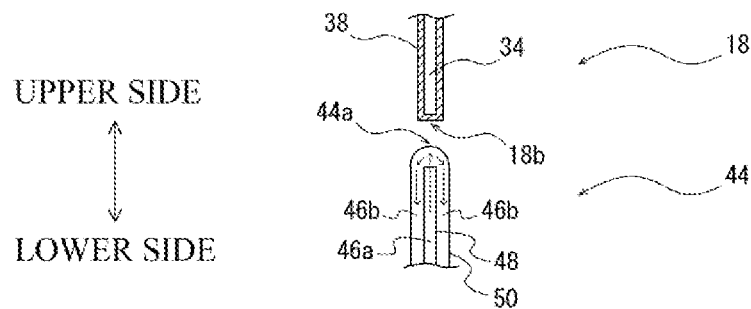
FIG. 4A is an enlarged view enlarging a cooling rod in the production apparatus for a metal oxide single crystal shown in FIG. 1A.

Next, the cooling rod 44 which is a configuration characteristic of the present invention will be described. FIG. 4A is an enlarged view enlarging the cooling rod 44 shown in FIG. 1A. FIGS. 4B to 4D and 5 show other examples of the cooling rod 44. Further, FIG. 6 is an explanatory view illustrating an operational effect of the cooling rod 44. All the drawings are vertical sectional views showing the cooling rod 44 and peripheral configurations thereof, but some peripheral configurations are omitted as needed so as to facilitate the visual recognition of the configuration of the cooling rod 44.

Figure 4B:
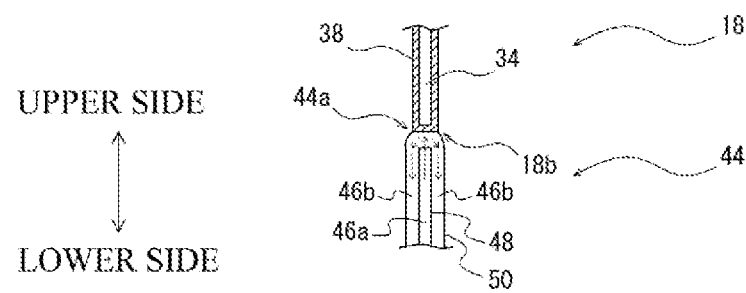
FIGS. 4B, 4C, and 4D are schematic views (vertical sectional views) showing other examples of the cooling rod shown in FIG. 4A.

In the cooling rod 44 according to the present embodiment, in one example, as shown in FIG. 1A and FIG. 4A which is an enlarged view of FIG. 1A, one end (here, an upper end 44a) thereof is provided in proximity to the lower end 18b of the crucible 18. Further, in the cooling rod 44 according to the present embodiment, in another example, as shown in FIG. 4B, one end (here, the upper end 44a) thereof is provided in contact with the lower end 18b of the crucible 18.

With the use of the cooling rod 44, by providing the cooling rod 44 in contact with (FIG. 4B) or in proximity to (FIG. 4A) the lower end 18b of the crucible 18, the lower end 18b of the crucible 18 is deprived of heat, so that the lower end 18b can be cooled. Therefore, by cooling a portion of the seed crystal 34 (a lower portion of the seed crystal 34) coming in contact with the lower end 18b of the crucible 18, a temperature difference such that the temperature on the lower side is relatively low, and the temperature on the upper side is relatively high, that is, a temperature difference in the crystal growth direction can be generated in the seed crystal 34. Therefore, the description here that the upper end 44a of the cooling rod 44 is provided in proximity to the lower end 18b of the crucible 18 means that the upper end 44a of the cooling rod 44 is disposed in the vicinity of the lower end 18b of the crucible 18 to such an extent that the cooling rod 44 can receive heat of the lower end 18b of the crucible 18.

Specifically, in one example, in the below-mentioned Examples, a temperature difference of about 6.6° C. (6.40° C. in the configuration in FIG. 4A, and 6.80° C. in the configuration in FIG. 4B) can be generated in the vertical direction of the seed crystal 34. Further, when air is allowed to flow at 2.0 L/min through a flow path 46 provided inside the cooling rod 44, a temperature difference of about 9.5° C. (9.25° C. in the configuration in FIG. 4A, and 9.80° C. in the configuration in FIG. 4B) can be generated (the details of the cooling rod 44 will be described later). Further, even when the small-diameter section 38 which is a housing section for the seed crystal 34 is positioned in a region where the temperature gradient in the vertical direction is extremely small by raising the height position of the crucible 18, a temperature difference of about 2.6° C. (2.65° C. in the configuration in FIG. 4A, and 2.45° C. in the configuration in FIG. 4B) can be generated in the vertical direction of the seed crystal 34. Further, when air is allowed to flow at 2.0 L/min through the flow path 46 provided inside the cooling rod 44, a temperature difference of about 3.7° C. (3.50° C. in the configuration in FIG. 4A, and 3.80° C. in the configuration in FIG. 4B) can be generated.

On the other hand, in the conventional configuration in which the cooling rod 44 is not provided, according to the measurement by the inventor, the temperature difference in the vertical direction of the seed crystal 34 was sometimes as small as, for example, about 0.5 to 1.0° C. From this, it is found that with the use of the cooling rod 44, a temperature difference in the crystal growth direction can be reliably generated in the seed crystal 34. As a result, as shown in FIG. 6, a portion of the seed crystal 34 is melted to form the melted portion 34A on a crystal raw material 36 side (crystal raw material melt 36A side) in the seed crystal 34 and an unmelted portion 34B on the opposite side, so that seeding can be performed reliably. Further, the crystal raw material 36 is melted to form the crystal raw material melt 36A, and then, the crystal raw material melt 36A can be grown into a crystal starting from the melted portion 34A of the seed crystal 34.

The cooling rod 44 is an extended member having both ends: one end (here, the upper end 44a); and the other end (here, a lower end 44b). In the present embodiment, as shown in FIGS. 4A and 4B, it is formed in the shape of a single shaft as a whole, but it is not limited thereto, and it may be curved or bent in the middle. Further, in the present embodiment, it is extended along the crystal growth direction, but it is not limited thereto, and any angle may be taken with respect to the crystal growth direction. The "third end" in the claims of the present application corresponds to the upper end 44a in the present embodiment. Further the "fourth end" in the claims of the present application corresponds to the lower end 44b in the present embodiment.

The material of the cooling rod 44 is not limited. In one example, a ceramic material such as alumina, zirconia, or magnesia, and a metal material such as a platinum-based alloy (for example, a platinum-rhodium alloy, a platinum-iridium alloy, or the like), or the like can be used. Since it is provided as a member having a cooling function, it can be said that it may be composed of a material having a predetermined thermal conductivity. However, an appropriate material may be selected according to the internal configuration (for example, solid, hollow, or the like) of the cooling rod 44, and the atmospheric environment in the furnace 14, the temperature environment in the furnace 14 due to the melting point of a metal oxide to be produced, or the like.

Figure 4C:
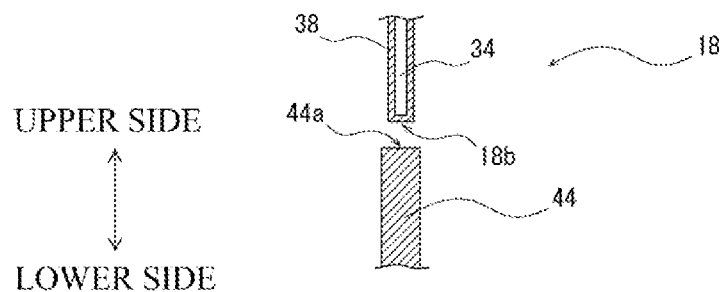
Figure 4D:
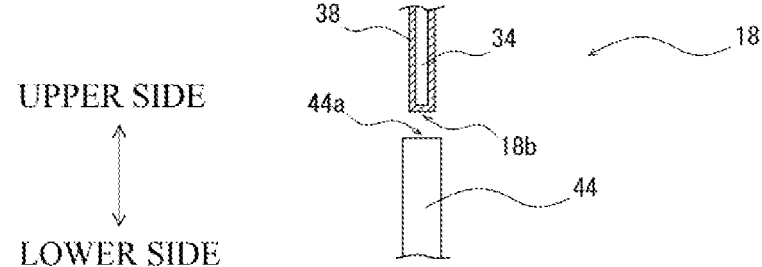

The internal configuration of the cooling rod 44 is not limited. As shown in FIG. 4C, it may be formed solid, or as shown in FIG. 4D, it may be formed hollow. Alternatively, it may be composed of a solid portion and a hollow portion (not shown). In the present embodiment, as shown in FIGS. 4A and 4B, the flow path 46 for allowing a fluid to flow therethrough is provided inside the cooling rod 44.

With the use of the flow path 46, a fluid is allowed to flow at the upper end 44a of the cooling rod 44, and the lower end 18b of the crucible 18 is deprived of heat by the fluid to cool the lower end 18b, and also the fluid having received heat is allowed to arbitrarily flow, and heat is appropriately released from around the lower end 18b, whereby a more excellent cooling effect can be exhibited.

As a configuration example of the flow path 46, as shown in FIGS. 4A and 4B, the cooling rod 44 according to the present embodiment has a double pipe structure. More specifically, the inside of an inner pipe 48 in the double pipe structure serves as a forward flow path 46a through which the fluid flows from a lower end 44b side to an upper end 44a side of the cooling rod 44. Further, a gap between the inner pipe 48 and an outer pipe 50 in the double pipe structure serves as a return flow path 46b through which the fluid flows from the upper end 44a side to the lower end 44b side of the cooling rod 44. Further, the forward flow path 46a and the return flow path 46b are configured to communicate with each other inside the upper end 44a of the cooling rod 44.

According to this, the fluid introduced into the flow path 46 of the cooling rod 44 flows through the forward flow path 46a being an inner circumferential path and reaches the upper end 44a of the cooling rod 44 and deprives the lower end 18b of the crucible 18 of heat, and also enters the return flow path 46b at the upper end 44a, and flows through the return flow path 46b being an outer circumferential path, and is discharged outside the cooling rod 44 (that is, outside the furnace 14) (see dashed line arrows).

According to this configuration, by allowing the fluid to flow back and forth in the cooling rod 44 and discharging the fluid having received heat outside the furnace 14, the effect on the temperature environment and the atmospheric environment in the furnace 14 is suppressed, and the cooling effect on the lower end 18b of the crucible 18 to be cooled can be reliably obtained. Further, by providing the forward flow path 46a as the inner circumferential path separately from the external environment (that is, the inside of the furnace 14), the fluid flowing through the forward flow path 46a can be prevented from receiving heat in the furnace 14 before reaching the upper end 44a of the cooling rod 44. Therefore, the fluid is allowed to stably act on the lower end 18b of the crucible 18, so that the cooling effect can be improved.

Figure 5:
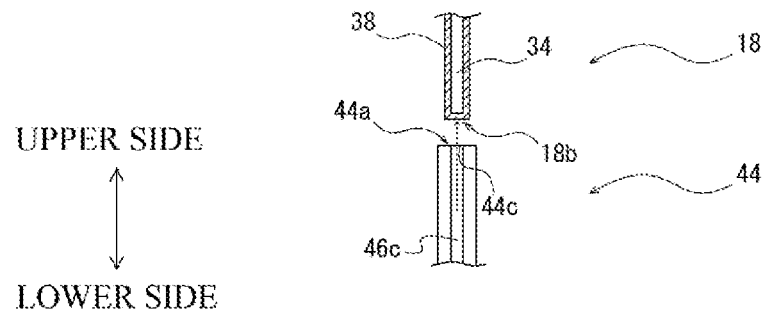
FIG. 5 is a schematic view (vertical sectional view) showing another example of the cooling rod shown in FIG. 4A.
Figure 6:
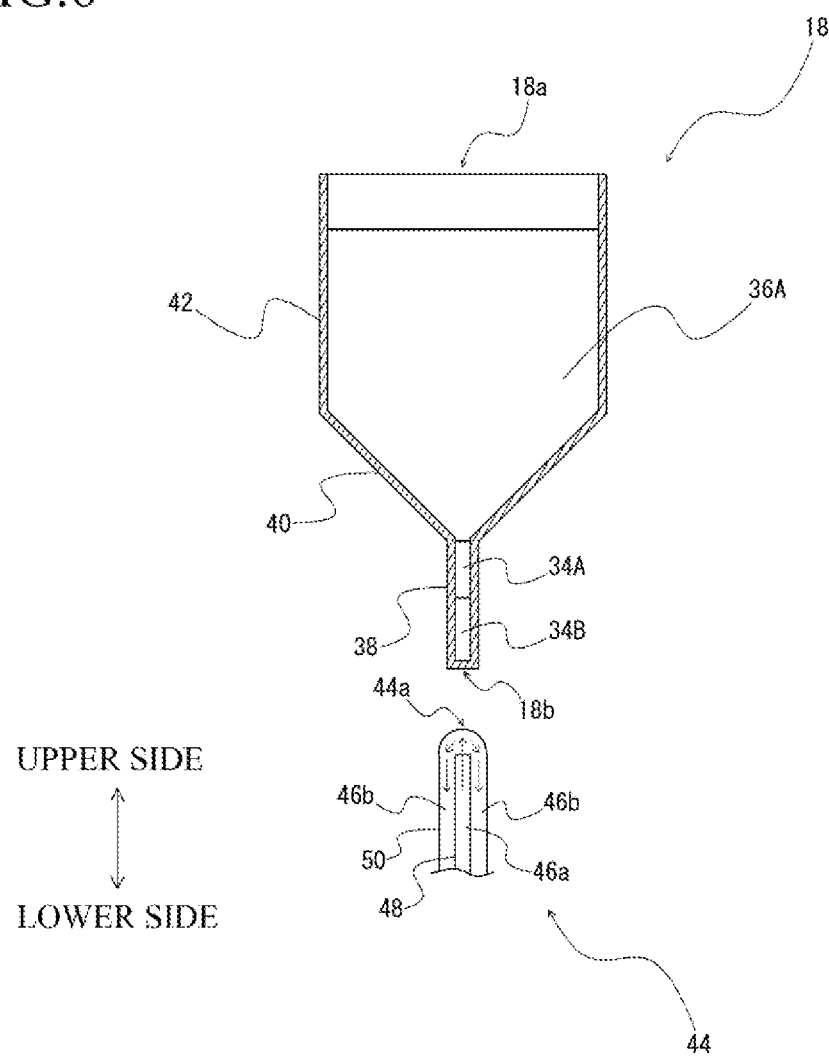
FIG. 6 is an explanatory view illustrating an operational effect of the cooling rod in the production apparatus for a metal oxide single crystal according to the first embodiment of the present invention.

Further, as another configuration example of the flow path 46, as shown in FIG. 5, the apparatus 10 may be configured such that an opening 44c is provided at the upper end 44a of the cooling rod 44, and the fluid flowing through the flow path 46 to the upper end 44a side from the lower end 44b side is discharged to the lower end 18b of the crucible 18 from the opening 44c (see a dashed line arrow).

According to this configuration, the fluid is introduced into the furnace 14, and therefore, there arises a need to appropriately control the temperature environment and the atmospheric environment in the furnace 14, but by directly hitting the fluid to the lower end 18b of the crucible 18, the cooling effect can be improved. In that case, in one example, by using the same gas (for example, a gas with the same oxygen concentration) as the atmosphere in the furnace 14 as the fluid, the effect on the environment in the furnace 14 can be reduced.

Here, in one example, a configuration in which a hollow pipe shown in FIG. 4D is used as the cooling rod 44 as it is, and the fluid is allowed to flow through the pipe and also the fluid is discharged from the upper end 44a that is open may be adopted. According to this, the cooling rod 44 including the flow path 46 having the opening 44c at the upper end 44a can be easily realized. On the other hand, in another example, as shown in FIG. 5, a configuration in which the cooling rod 44 has a double pipe structure in which a small-diameter hollow pipe is provided in a large-diameter hollow pipe, and the fluid is allowed to flow through the small-diameter hollow pipe, and also the fluid is discharged from the upper end 44a that is open may be adopted. According to this, by providing the flow path 46 as an inner circumferential path 46c separately from the external environment (that is, the inside of the furnace 14), the fluid flowing through the inner circumferential path 46c can be prevented from receiving heat in the furnace 14 before reaching the upper end 44a of the cooling rod 44. Therefore, the fluid is allowed to stably act on the lower end 18b of the crucible 18, so that the cooling effect can be improved.

The fluid flowing through the flow path 46 is not limited and may be a gas or a liquid, but it flows inside the furnace 14 at a high temperature, and therefore, a gas is more suitable than a liquid that has the potential to evaporate. The type of gas is also not limited, and air in a room where the apparatus 10 is placed (that is, the atmosphere) may be allowed to flow as it is, or a predetermined gas other than air may be allowed to flow. The flow rate (flow velocity) of the gas is also not limited, and in one example, in Example described later, a predetermined temperature difference can be generated in the seed crystal 34 at 1.0 L/min.

Further, as shown in FIG. 4B, in the configuration in which the upper end 44a of the cooling rod 44 is provided in contact with the lower end 18b of the crucible 18, it is preferred that the cooling rod 44 is formed by processing (the crucible 18 is also processed as needed) so that the upper end 44a of the cooling rod 44 and the lower end 18b of the crucible 18 are in surface contact with each other. According to this, by configuring such that the contact area of the cooling rod 44 with the lower end 18b of the crucible 18 to be cooled is increased so that the cooling rod 44 receives more heat, the cooling effect can be improved.

Further, as shown in FIG. 1A, the cooling rod 44 according to the present embodiment is provided inside the hollow crucible shaft 16. According to this, by providing the cooling rod 44 separately from the external environment (that is, the inside of the furnace 14), the cooling rod 44 can be prevented from receiving heat in the furnace 14 (the crystal growth section 15a or the recessed section 15b).

At that time, it is preferred that the cooling rod 44 is disposed so as to coincide with the central axis of the crucible shaft 16. According to this, the cooling rod 44 is prevented from coming in contact with the inner wall of the crucible shaft 16, so that sintering, deformation, and cracking of the cooling rod 44 due to a high temperature can be prevented. Further, since the central axis of the crucible 18 and the central axis of the cooling rod 44 coincide with each other, the lower end 18b of the crucible 18 is deprived of heat from the center, and the entire lower end 18b of the crucible 18 can be uniformly and stably cooled.

In one example, in the present embodiment, as shown in FIG. 1A, a guide member 52 (for example, a guide ring) that fixes the cooling rod 44 to the center is provided inside the crucible shaft 16, so that a configuration in which the central axis of the crucible 18 and the central axis of the cooling rod 44 coincide with each other is achieved. The material of the guide member 52 is not limited. In one example, a ceramic material such as alumina, zirconia, or magnesia, a metal material such as platinum or a platinum-based alloy (for example, a platinum-rhodium alloy, a platinum-iridium alloy, or the like), or the like can be used. Further, the number of guide members 52, positions thereof, etc. are also not limited.

A part or the whole of the cooling rod 44 may be provided outside the crucible shaft 16. At that time, for example, outside the crucible shaft 16, the cooling rod 44 may be separated from the external environment (that is, the inside of the furnace 14) by a configuration covering the circumference of the cooling rod 44 with a heat retaining material, or the like.

Second Embodiment

Next, a second embodiment of the present invention will be described. The present embodiment is an example of the production apparatus 10 for a metal oxide single crystal to which an HB method, an HGF method, or the like that involves growing a crystal in the horizontal direction can be applied. Since a known HB furnace, an HGF furnace, or the like is applied, the description of the basic configuration of the apparatus 10 is omitted. Here, the cooling rod 44 characteristic of the present invention will be described.

Figure 7A:
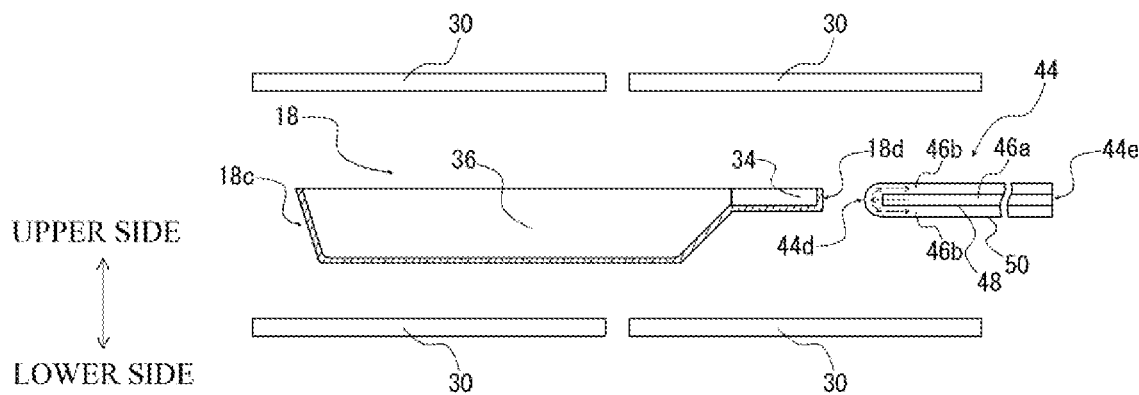
FIG. 7A is a schematic view (vertical sectional view) showing an example of a cooling rod in a production apparatus for a metal oxide single crystal according to a second embodiment of the present invention.
Figure 7B:
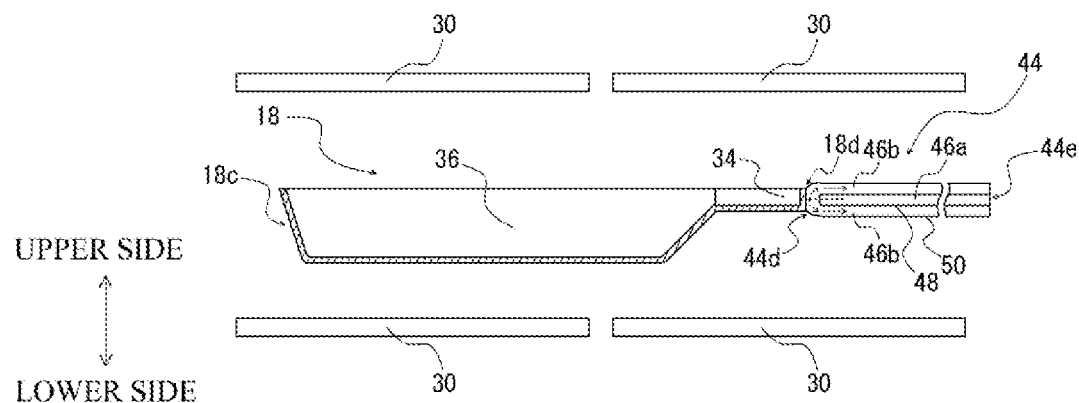
FIGS. 7B and 7C are schematic views (vertical sectional views) showing other examples of the cooling rod shown in FIG. 7A.
Figure 7C:
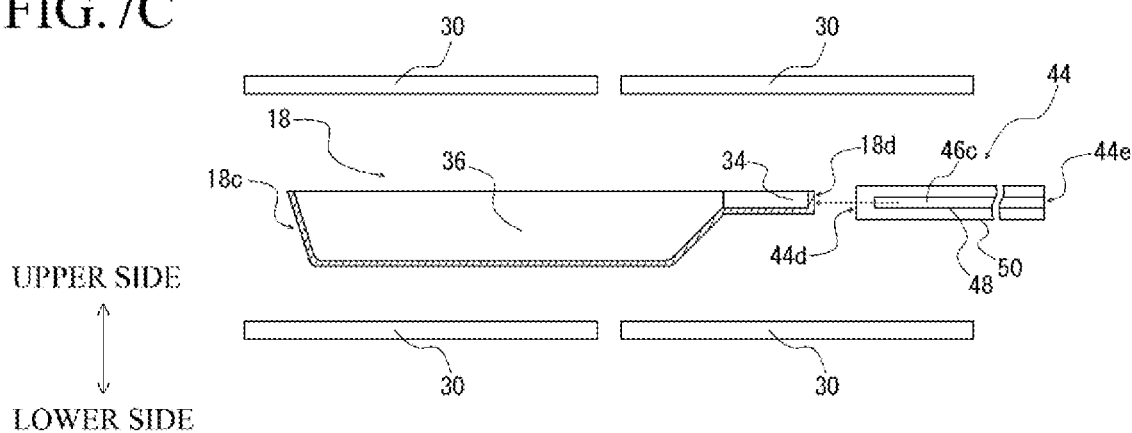
Figure 8A:
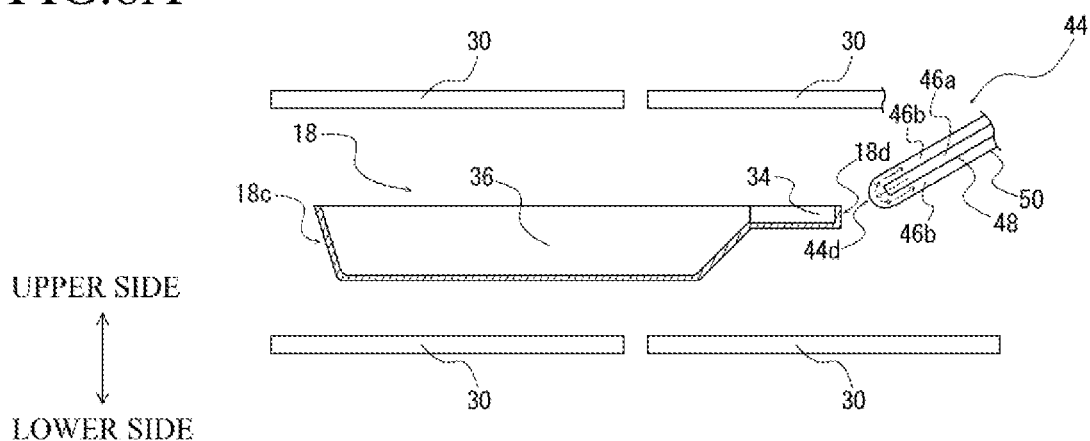
FIGS. 8A, 8B, and 8C are explanatory views showing arrangement examples of the cooling rod shown in FIG. 7A.
Figure 8B:
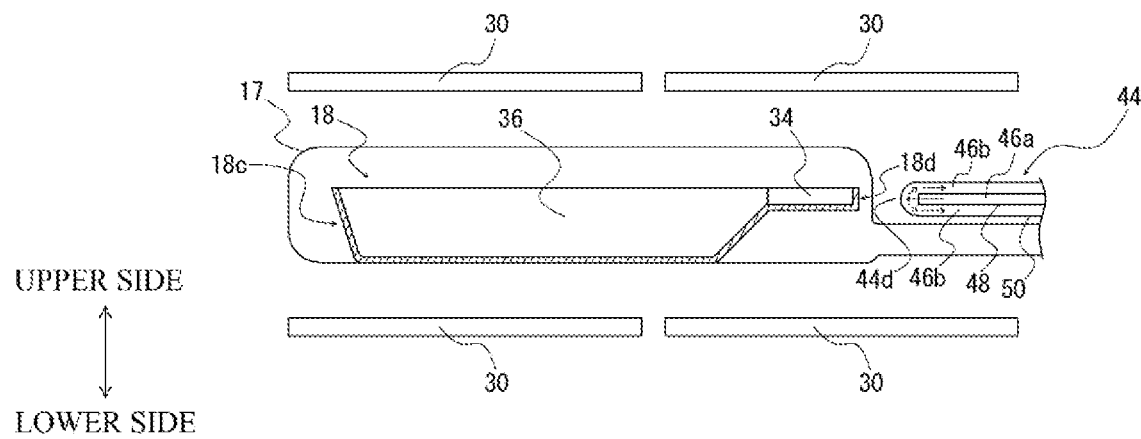
Figure 8C:
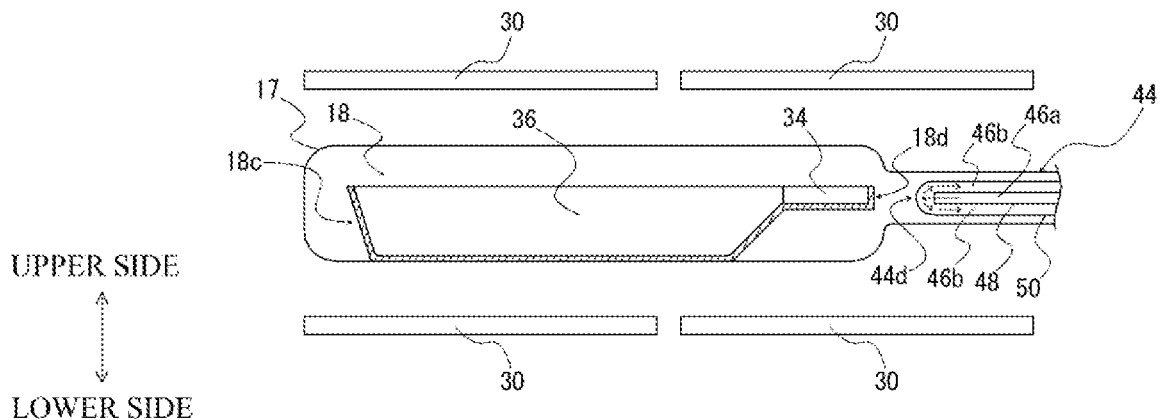
Figure 9:
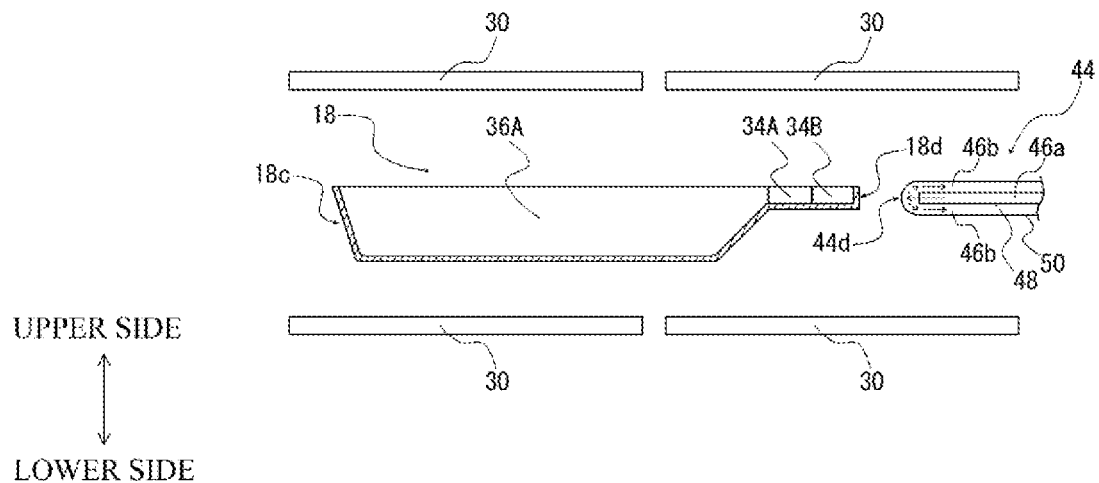
FIG. 9 is an explanatory view illustrating an operational effect of the cooling rod in the production apparatus for a metal oxide single crystal according to the second embodiment of the present invention.

FIG. 7A shows the cooling rod 44 according to the present embodiment. FIGS. 7B and 7C show other examples of the cooling rod 44. FIGS. 8A, 8B, and 8C are explanatory views showing arrangement examples of the cooling rod 44. Further, FIG. 9 is an explanatory view illustrating an operational effect of the cooling rod 44. All the drawings are vertical sectional views showing the cooling rod 44 and peripheral configurations, but some peripheral configurations are omitted as needed so as to facilitate the visual recognition of the configuration of the cooling rod 44.

As shown in FIG. 7A, the crucible 18 according to the present embodiment is a boat-shaped crucible 18 that is applied to the furnace 14 in which a crystal is grown in the horizontal direction. The "first end" in the claims of the present application corresponds to one end 18c of a side wall in the present embodiment. Further the "second end" in the claims of the present application corresponds to the other end 18d of the side wall, which is on the opposite side to the one end 18c of the side wall in the present embodiment. In the crucible 18 according to the present embodiment, the crystal raw material 36 is disposed a side of on the one end 18c of the side wall, and the seed crystal 34 is disposed on a side of the other end 18d of the side wall to house the crystal raw material 36 and the seed crystal 34. According to this, the seed crystal 34 and the crystal raw material 36 are housed in the crucible 18 in the same alignment direction as the crystal growth direction (the horizontal direction). By disposing the crucible 18 in the furnace 14 in a predetermined direction, the seed crystal 34 is disposed on the starting point side in the crystal growth direction, and the crystal raw material 36 is disposed on the end point side.

As shown in FIG. 7A, the cooling rod 44 according to the present embodiment is an extended member having both ends: one end 44d corresponding to the third end in the claims of the present application; and the other end 44e corresponding to the fourth end in the claims of the present application. In the cooling rod 44 according to the present embodiment, in one example, the one end 44d is provided in proximity to the other end 18d of the crucible 18. Further, in the cooling rod 44 according to the present embodiment, in another example, as shown in FIG. 7B, the one end 44d is provided in contact with the other end 18d of the crucible 18.

As shown in FIGS. 7A and 7B, in the present embodiment, the cooling rod 44 having the same structure as in the first embodiment shown in FIG. 4A is provided in proximity to or in contact with the other end 18d of the crucible 18 as described above in a tilted state by 90°. With the use of the cooling rod 44, the other end 18d being a portion of the crucible 18, with which a portion of the seed crystal 34 (on the opposite side to the crystal raw material 36 side) set so as to become the unmelted portion 34B when melting a portion of the seed crystal 34 (on the crystal raw material 36 side) to perform seeding comes in contact, is deprived of heat, so that the other end 18d can be cooled. Therefore, as shown in FIG. 9, in the apparatus 10 to which a crystal growth method for growing a crystal in the horizontal direction is applied according to the present embodiment, a temperature difference in the crystal growth direction is generated by the cooling rod 44, and the melted portion 34A is formed on the crystal raw material 36 side (crystal raw material melt 36A side) in the seed crystal 34 and the unmelted portion 34B is formed on the opposite side, so that seeding can be performed reliably. Further, the crystal raw material 36 is melted to form the crystal raw material melt 36A, and then, the crystal raw material melt 36A can be grown into a crystal starting from the melted portion 34A of the seed crystal 34.

However, the cooling rod 44 does not necessarily need to be extended along the crystal growth direction, and in one example, as shown in FIG. 8A, it may be provided with any angle with respect to the crystal growth direction.

Since the structure of the cooling rod 44 according to the present embodiment is the same as in the first embodiment, a detailed description thereof is omitted. In one example, the flow path 46 for allowing a fluid to flow therethrough may be provided therein. As shown in FIGS. 7A and 7B, the flow path 46 may be configured in the same manner as in FIGS. 4A and 4B by providing the forward flow path 46a and the return flow path 46b. Alternatively, the flow path 46 may be configured in the same manner as in FIG. 5 by providing the opening 44c at the one end 44d as shown in FIG. 7C.

In addition, in the apparatus 10 to which a crystal growth method for growing a crystal in the horizontal direction is applied according to the present embodiment, the crucible shaft 16 extended in the vertical direction is not provided at a lower side of the crucible 18 as in the first embodiment. On the other hand, in the present embodiment, in the apparatus 10 to which an HB method or the like is applied, as shown in FIGS. 8B and 8C, a crucible moving section 17 that moves the crucible 18 in the horizontal direction is provided. A part or the whole of the cooling rod 44 may be provided outside the crucible moving section 17 as shown in FIG. 8B, or may be provided inside the crucible moving section 17 as shown in FIG. 8C.

The production apparatus 10 for a metal oxide single crystal according to the first and second embodiments including the cooling rod 44 as described above can be particularly suitably applied to the apparatus 10 for producing a high-melting point metal oxide single crystal in an oxidizing atmosphere. For example, in a vacuum environment or an inert gas atmosphere environment such as argon, it is relatively easy to form a high-temperature furnace exceeding 2000° C., but a material that has a high melting point and is stable in an oxidizing atmosphere is limited. Therefore, in a high-temperature furnace with an oxidizing atmosphere, in one example, the internal furnace pipe 28 is provided in the furnace 14 to improve the heat retaining property in the furnace 14, or the support 16a is provided on the top of the crucible shaft 16 to protect the crucible 18. However, according to such a configuration, it becomes difficult to generate a temperature gradient around the crucible 18 in the furnace 14, and the temperature control of the seed crystal 34 becomes difficult. On the other hand, with the use of the cooling rod 44, a temperature difference in the crystal growth direction is reliably generated in the seed crystal 34, so that the seeding can be performed reliably. Accordingly, in one example, the production apparatus 10 for a metal oxide single crystal according to the first and second embodiments can be suitably applied as the production apparatus 10 for a gallium oxide crystal in which the inside of the furnace 14 is heated to 1800° C. or higher in an oxidizing atmosphere, or the like.

(Production Method for Metal Oxide Single Crystal)

Further, the production method for a metal oxide single crystal according to the present embodiment is characterized in that in a production method for a metal oxide single crystal, in which a crucible housing a seed crystal and a crystal raw material is heated by a heater so that a temperature difference is generated in the seed crystal to melt a portion of the seed crystal and also to melt the crystal raw material, and the melted portion of the seed crystal and the melted crystal raw material are solidified and crystallized from the seed crystal side to the crystal raw material side, from the outside of the crucible, a cooling rod is provided in contact with or in proximity to a crucible portion with which a seed crystal portion whose temperature is set to the lowest temperature when the temperature difference is generated in the seed crystal comes in contact, whereby the crucible portion is deprived of heat and cooled by the cooling rod.

As an example of the production method for a metal oxide single crystal according to the present embodiment, a method for producing a metal oxide single crystal using the production apparatus 10 for a metal oxide single crystal according to the first and second embodiments can be exemplified.

EXAMPLES

Figure 10:
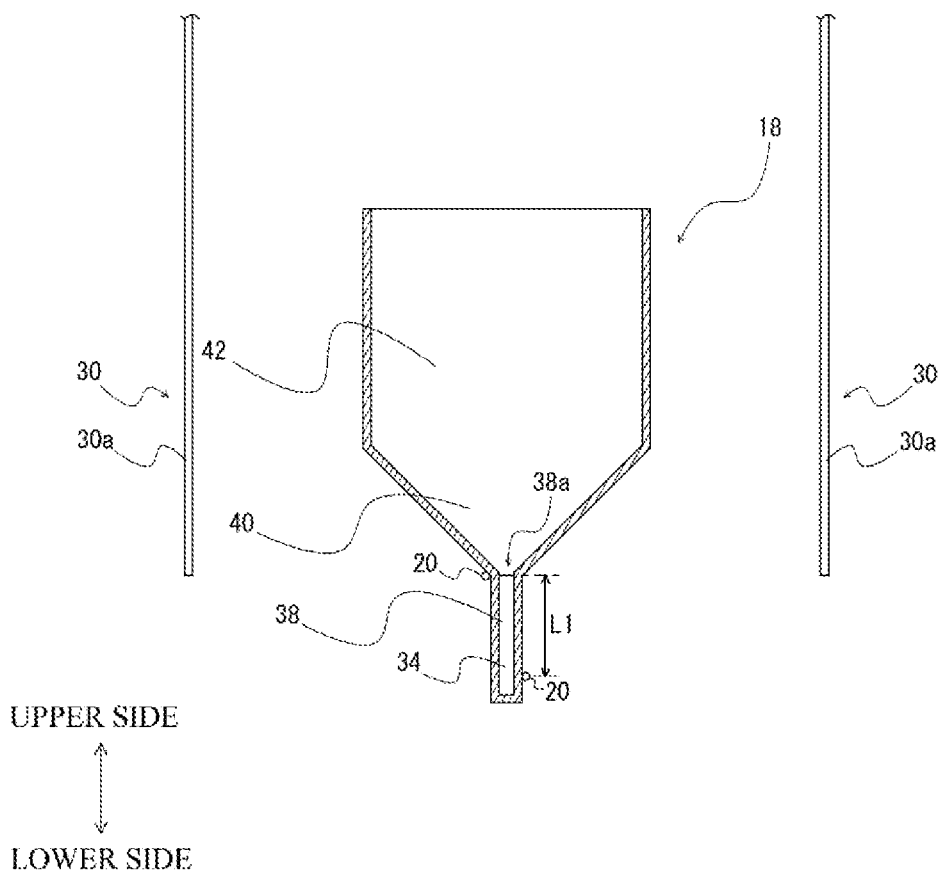
FIG. 10 is an explanatory view illustrating a method of Example 1.

By using the production apparatus 10 for a metal oxide single crystal in which the cooling rod 44 shown in FIG. 4A or the cooling rod 44 shown in FIG. 4B is applied to the basic configuration shown in FIG. 1A, in the furnace 14 in an oxidizing atmosphere, the crucible 18 housing a gallium oxide ($\beta$-$Ga_2O_3$) crystal as the seed crystal 34 was heated, and also the lower end 18b of the crucible 18 was cooled by the cooling rod 44, and the temperature of a predetermined portion of the crucible 18 was measured by the thermocouple 20. Hereinafter, the apparatus 10 to which the cooling rod 44 shown in FIG. 4A (a configuration in which the cooling rod 44 is provided in proximity to the crucible 18) is applied is sometimes referred to as "proximity-type apparatus". Further, the apparatus 10 to which the cooling rod 44 shown in FIG. 4B (a configuration in which the cooling rod 44 is provided in contact with the crucible 18) is applied is sometimes referred to as "contact-type apparatus". The gap between the lower end 18b of the crucible 18 and the upper end 44a of the cooling rod 44 in the proximity-type apparatus was set to 4 mm. As shown in FIG. 10, as the crucible 18, one in which the cross-sectional diameter of the large-diameter section 42 is 4 inches was used, and a $\beta$-$Ga_2O_3$ crystal was filled as the seed crystal 34 up to an upper end 38a of the small-diameter section 38. Further, the temperature measuring section of the thermocouple 20 was disposed at a height position (temperature measurement point 1) of the upper end 38a of the small-diameter section 38 of the crucible 18 and at a height position (temperature measurement point 2) about 40 mm below the temperature measurement point 1 (a gap L1 between the temperature measurement point 1 and the temperature measurement point 2 is 40 mm).

Example 1

The crucible 18 was heated in a state where the crucible 18 was positioned at a height where the upper end 38a of the small-diameter section 38 substantially coincides with the tip of the heat generating section 30a of the heater 30 (the state shown in FIG. 10), and the lower end 18b of the crucible 18 was cooled by the cooling rod 44, and then, the temperature was measured by the thermocouple 20. The results are shown in Table 1.

TABLE 1

| Contact-type apparatus | Flow rate of air [L/min] | | | Proximity-type apparatus | Flow rate of air [L/min] | | |
|---|---|---|---|---|---|---|---|
| | 0.0 | 1.0 | 2.0 | | 0.0 | 1.0 | 2.0 |
| Temperature measurement point 1 | 7.80 | 6.20 | 2.05 | Temperature measurement point 1 | 7.40 | 5.60 | 1.95 |
| Temperature measurement point 2 | 1.00 | −0.85 | −7.75 | Temperature measurement point 2 | 1.00 | −1.30 | −7.30 |
| Temperature difference | 6.80 | 7.05 | 9.80 | Temperature difference | 6.40 | 6.90 | 9.25 |

The temperature [° C.] shown in Table 1 is expressed as a relative value obtained by converting the temperature at the temperature measurement point 2 when air was not allowed to flow through the flow path 46 in the cooling rod 44 (flow rate: 0.0 L/min) into 1.00° C. (hereinafter, the same shall apply to Tables 2 and 3). As shown in Table 1, with the use of the cooling rod 44, in a state where air was not allowed to flow through the flow path 46 in the cooling rod 44 (flow rate: 0.0 L/min), between the top (temperature measurement point 1) and the bottom (temperature measurement point 2) of the small-diameter section 38 housing the β-Ga$_2$O$_3$ crystal as the seed crystal 34, a temperature difference of 6.40° C. in the proximity-type apparatus and 6.80° C. in the contact-type apparatus could be generated. This indicates the cooling effect of the hollow cooling rod 44 which is configured in a substantially cylindrical shape closed at one end.

Further, when air was allowed to flow through the flow path 46 in the cooling rod 44, the temperature difference between the top (temperature measurement point 1) and the bottom (temperature measurement point 2) of the small-diameter section 38 could be further increased in both the proximity-type apparatus and the contact-type apparatus. As the air flow rate was increased, the temperature difference increased, and in the case where the flow rate was 2.0 L/min, a large temperature difference of 9.25° C. in the proximity-type apparatus and 9.80° C. in the contact-type apparatus could be generated. When air is allowed to flow through the flow path 46 in the cooling rod 44, not only the temperature of the bottom of the small-diameter section 38, but also the temperature of the top thereof decreases to some extent. However, the decrease in temperature at the top was restrictive, and by greatly lowering the temperature of the bottom, the temperature difference between the top and the bottom could be further increased. In addition, in comparison between the apparatus 10 in which the cooling rod 44 was brought into contact with the crucible 18 (contact-type apparatus) and the apparatus 10 in which the cooling rod 44 was brought into proximity to the crucible 18 (proximity-type apparatus), the temperature difference was larger in the contact-type apparatus.

Example 2

The crucible 18 was heated in a state where the crucible 18 was positioned at a height raised by 35 mm from the height position in Example 1, and the lower end 18b of the crucible 18 was cooled by the cooling rod 44, and then, the temperature was measured by the thermocouple 20. The results are shown in Table 2.

TABLE 2

| Contact-type apparatus | Flow rate of air [L/min] | | | Proximity-type apparatus | Flow rate of air [L/min] | | |
|---|---|---|---|---|---|---|---|
| | 0.0 | 1.0 | 2.0 | | 0.0 | 1.0 | 2.0 |
| Temperature measurement point 1 | 5.00 | 3.45 | −0.15 | Temperature measurement point 1 | 5.15 | 3.65 | 0.40 |
| Temperature measurement point 2 | 1.00 | −1.15 | −6.55 | Temperature measurement point 2 | 1.00 | −0.75 | −5.60 |
| Temperature difference | 4.00 | 4.60 | 6.40 | Temperature difference | 4.15 | 4.40 | 6.00 |

In the furnace 14, as it goes to the top of the crystal growth section 15a, the temperature gradient in the vertical direction becomes smaller by entering a region to fall within the heat generating range of the heater 30. Along with this, an environment in which it is difficult to generate a temperature difference in the vertical direction of the seed crystal 34 is created. Therefore, in Example 2 in which the height position of the crucible 18 is set higher than in Example 1, as shown in Table 2, the temperature difference between the top (temperature measurement point 1) and the bottom (temperature measurement point 2) of the small-diameter section 38 housing the β-Ga$_2$O$_3$ crystal as the seed crystal 34 was smaller than in Example 1 as a whole. However, with the use of the cooling rod 44, in a state where air was not allowed to flow through the flow path 46 in the cooling rod 44 (flow rate: 0.0 L/min), a temperature difference of 4.15° C. in the proximity-type apparatus and 4.00° C. in the contact-type apparatus could be generated. Further, when air was allowed to flow through the flow path 46 in the cooling rod 44, the temperature difference could be further increased in both the proximity-type apparatus and the contact-type apparatus. In the same manner as in Example 1, as the air flow rate was increased, the temperature difference increased. In addition, in the same manner as in Example 1, in comparison between the apparatus 10 in which the cooling rod 44 was brought into contact with the crucible 18 (contact-type apparatus) and the apparatus 10 in which the cooling rod 44 was brought into proximity to the crucible 18 (proximity-type apparatus), the temperature difference was larger in the contact-type apparatus in a state where air was allowed to flow.

Example 3

The crucible 18 was heated in a state where the crucible 18 was positioned at a height additionally raised by 35 mm from the height position in Example 2, and the lower end 18*b* of the crucible 18 was cooled by the cooling rod 44, and then, the temperature was measured by the thermocouple 20. The results are shown in Table 3.

TABLE 3

| Contact-type | Flow rate of air [L/min] | | | Proximity-type | Flow rate of air [L/min] | | |
|---|---|---|---|---|---|---|---|
| apparatus | 0.0 | 1.0 | 2.0 | apparatus | 0.0 | 1.0 | 2.0 |
| Temperature measurement point 1 | 3.45 | 2.30 | −0.85 | Temperature measurement point 1 | 3.65 | 2.10 | −0.70 |
| Temperature measurement point 2 | 1.00 | −0.65 | −4.65 | Temperature measurement point 2 | 1.00 | −0.45 | −4.20 |
| Temperature difference | 2.45 | 2.95 | 3.80 | Temperature difference | 2.65 | 2.55 | 3.50 |

In Example 3, the height position of crucible 18 is further higher by 35 mm than in Example 2, so that an environment in which it is more difficult to generate a temperature difference in the vertical direction of the seed crystal 34 is created. Therefore, in Example 3, as shown in Table 3, the temperature difference between the top (temperature measurement point 1) and the bottom (temperature measurement point 2) of the small-diameter section 38 housing the β-Ga$_2$O$_3$ crystal as the seed crystal 34 was smaller than in Example 1 and Example 2 as a whole. However, with the use of the cooling rod 44, in a state where air was not allowed to flow through the flow path 46 in the cooling rod 44 (flow rate: 0.0 L/min), a temperature difference of 2.65° C. in the proximity-type apparatus and 2.45° C. in the contact-type apparatus could be generated. Further, when air was allowed to flow through the flow path 46 in the cooling rod 44, the temperature difference could be further increased at a flow rate of 1.0 L/min or more in the contact-type apparatus, and at a flow rate of 2.0 L/min or more in the proximity-type apparatus. In addition, in the same manner as in Example 1 and Example 2, as the air flow rate was increased, the temperature difference increased. In comparison between the apparatus 10 in which the cooling rod 44 was brought into contact with the crucible 18 (contact-type apparatus) and the apparatus 10 in which the cooling rod 44 was brought into proximity to the crucible 18 (proximity-type apparatus), the temperature difference was larger in the contact-type apparatus in a state where air was allowed to flow.

What is claimed is:

1. A production apparatus for a metal oxide single crystal, characterized by comprising:
   a crucible for housing a crystal raw material and a seed crystal, which has a first end and a second end, and in which the crystal raw material is disposed on a side of the first end and the seed crystal is disposed on a side of the second end;
   a heater that heats the crucible;
   a cooling rod, which has a third end and a fourth end, and in which the third end is provided in contact with or in proximity to the second end of the crucible so as to cool the second end by depriving the second end of heat, the third end of the cooling rod being provided in proximity to the second end of the crucible, the third end of the cooling rod having an opening; and
   a flow path for allowing a fluid to flow therethrough inside the cooling rod,
   wherein the fluid flowing through the flow path to the side of the third end from the side of the fourth end of the cooling rod is discharged to the second end of the crucible from the opening.

2. The production apparatus for a metal oxide single crystal according to claim 1, characterized in that
   the flow path is composed of a forward flow path through which the fluid flows to a side of the third end from a side of the fourth end of the cooling rod, and a return flow path through which the fluid flows to the side of the fourth end from the side of the third end of the cooling rod, and
   the forward flow path and the return flow path communicate with each other inside the third end of the cooling rod.

3. The production apparatus for a metal oxide single crystal according to claim 2, characterized in that
   the cooling rod has a double pipe structure, and the inside of an inner pipe in the double pipe structure serves as the forward flow path, and a gap between the inner pipe and an outer pipe serves as the return flow path.

4. The production apparatus for a metal oxide single crystal according to claim 1, characterized in that in a configuration in which the third end of the cooling rod is provided in contact with the second end of the crucible,
   the third end of the cooling rod and the second end of the crucible are configured to be in surface contact with each other.

5. The production apparatus for a metal oxide single crystal according to claim 1, characterized in that
   the cooling rod is extended inside a crucible moving section that moves the crucible.

6. The production apparatus for a metal oxide single crystal according to claim 1, characterized in that
   the crucible is disposed with the first end facing upward and the second end facing downward,
   a crucible shaft that supports the second end of the crucible from underneath is provided, and
   the cooling rod is extended inside the crucible shaft.

7. The production apparatus for a metal oxide single crystal according to claim 6, characterized in that
the cooling rod is disposed so as to coincide with the central axis of the crucible shaft.

8. The production apparatus for a metal oxide single crystal according to claim 1, characterized by being an apparatus for producing a metal oxide single crystal in an oxidizing atmosphere.

9. The production apparatus for a metal oxide single crystal according to claim 1, characterized by being an apparatus for producing a gallium oxide crystal.

10. A production method for a metal oxide single crystal, characterized in that in a production method for a metal oxide single crystal in which a crucible housing a seed crystal and a crystal raw material is heated by a heater so that a temperature difference is generated in the seed crystal to melt a portion of the seed crystal and also to melt the crystal raw material, and the melted portion of the seed crystal and the melted crystal raw material are solidified and crystallized from a side of the seed crystal to a side of the crystal raw material,
from the outside of the crucible, a cooling rod is provided in contact with or in proximity to a crucible portion with which a seed crystal portion whose temperature is set to the lowest temperature when the temperature difference is generated in the seed crystal comes in contact, whereby the crucible portion is deprived of heat and cooled by the cooling rod, and
a flow path for allowing a fluid to flow there through inside the cooling rod,
wherein the fluid flowing through the flow path to the side of the third end from the side of the fourth end of the cooling rod is discharged to the second end of the crucible from the opening.

* * * * *